United States Patent [19]

Marcantonio et al.

[11] Patent Number: 5,294,826
[45] Date of Patent: Mar. 15, 1994

[54] INTEGRATED CIRCUIT PACKAGE AND ASSEMBLY THEREOF FOR THERMAL AND EMI MANAGEMENT

[75] Inventors: Gabriel Marcantonio; Khanh Nguyen, both of Nepean, Canada

[73] Assignee: Northern Telecom Limited, Montreal, Canada

[21] Appl. No.: 47,084

[22] Filed: Apr. 16, 1993

[51] Int. Cl.⁵ .............................................. H01L 25/04
[52] U.S. Cl. ................................. 257/659; 257/691; 257/706; 257/676
[58] Field of Search .............. 257/659, 660, 677, 729, 257/691, 706, 676

[56] References Cited

U.S. PATENT DOCUMENTS 5,068,708  11/1991  Newman ............................. 257/659
5,138,431  8/1992  Huang et al. ....................... 257/677

Primary Examiner—Rolf Hille
Assistant Examiner—S. V. Clark
Attorney, Agent, or Firm—Angela C. de Wilton

[57] ABSTRACT

A package is provided for an integrated circuit comprising a combined heat dissipating and electromagnetic shielding structure. Conveniently, the heat dissipation and shielding structure is a laminated composite structure including layers of several materials having complementary characteristics to provide high magnetic permeability, electrical conductivity, and thermal conductivity. For example, a sandwich structure of layers of copper/Kovar TM/copper is effective in dissipating heat and reducing electromagnetic emission from ASICs for telecommunications applications, each dissipating in excess of 2 Watts. Preferably a substrate of the package includes a conductive die attach pad which may be grounded to bring a ground plane close to the integrated circuit. The composite electromagnetic shielding and heat dissipation structure is grounded to improve attenuation of radiated electromagnetic emission from the chip. The electromagnetic shielding and heat dissipation structure is applicable for packages for individual IC chips and for multi-chip modules.

19 Claims, 4 Drawing Sheets

INTEGRATED CIRCUIT PACKAGE AND ASSEMBLY THEREOF FOR THERMAL AND EMI MANAGEMENT

FIELD OF THE INVENTION

This invention relates to an integrated circuit package and an assembly of an integrated circuit chip and a package.

BACKGROUND OF THE INVENTION

Conventionally, an integrated circuit package provides for electrical connections from an integrated circuit chip to external conductors and for protection of the chip from the external environment. Additionally, management of electromagnetic emission and thermal dissipation are increasingly important considerations in the development of improved packaging for integrated circuit chips.

Large integrated circuits, for example, application specific integrated circuits (ASICs) used in telecommunications and other applications, may dissipate powers in excess of several Watts. Consequently, it may be necessary to provide an integrated circuit package with a heat sink. Conventionally a heat sink for a packaged integrated circuit may be provided by mounting the chip in thermal contact with a slug of thermally conductive metal or alloy having an exposed surface for dissipation of heat. Where greater heat dissipation is required, a heat sink may be provided with fins extending laterally of the package, to increase the exposed surface area for heat dissipation. However, the latter structure, of course, adds considerably to the size of the package.

To prevent electromagnetic interference (EMI) from unwanted radiated emissions generated by integrated circuits in electronic equipment, electromagnetic shielding of electronic systems may be required to meet various regulatory standards. Addition of shielding to meet increasingly stringent international regulations and standards for controlling electromagnetic interference (EMI), e.g. FCC requirements, may add significant cost to a system.

Typically, materials having characteristics suitable for application as a heat sink, i.e. good thermal conductivity, do not also have the characteristics required for electromagnetic shielding. With the continued drive towards reducing the dimensions of integrated circuit packages, conventional packaging techniques are severely challenged in providing both effective heat dissipation or control of electromagnetic interference in a readily manufacturable and reliable package.

The present invention seeks to provide an integrated circuit package with improved thermal management and control of electromagnetic interference.

SUMMARY OF THE INVENTION

Thus according to one aspect of the present invention there is provided an integrated circuit package, comprising: a body comprising a dielectric portion cooperable with a substrate portion for enclosing the integrated circuit with electrically conductive members extending from the integrated circuit through the dielectric portion of the body to an exterior of the body, the body also comprising a combined electromagnetic shielding and heat dissipation means comprising a plurality of layers forming a laminate structure overlying the dielectric portion and including: a layer of a thermally conductive material, a layer of a magnetic material having a high magnetic permeability to electromagnetic radiation generated by the integrated circuit, at least one of said plurality of layers comprising an electrically conductive material and having conductive grounding means.

Thus the integrated circuit package comprises a body with a composite structure which provides both electromagnetic shielding and heat dissipation. The electromagnetic shielding and heat dissipating means comprises multiple layers of different materials forming a laminated composite structure which combines the complementary properties of layers of different materials. Advantageously, the laminated structure includes at least a layer of a magnetic material having a high magnetic permeability for attenuating electromagnetic emission by magnetic effects, and a layer of thermally conductive material for heat dissipation. Preferably the thermally conductive material is also electrically conductive so that it may be grounded, and thus provides further electromagnetic attenuation by electro-conductive effects. Thus a package is provided which makes use of complementary properties of lamina of several materials to provide both effective thermal dissipation and control of radiated and conducted electromagnetic emission. The lamina structure allows for effective electromagnetic shielding and heat dissipation to be provided by a relatively compact, low volume, package. Conveniently, the integrated circuit may be thermally and electrically coupled to the shielding and heat dissipating structure through a substrate comprising a thermally conductive metal or alloy slug. The latter may also be grounded.

For example, the laminar structure may comprise a layer of copper to provide electrical and thermal conductivity, and a layer of Kovar TM. Kovar is a magnetic material with a high magnetic permeability which attenuates electromagnetic radiation by absorbing energy by magnetic effects. Grounding of the copper layer also provides electromagnetic shielding by electro-conductive effects.

Advantageously, the laminated structure of the shielding and heat dissipation means takes the form of a sandwich of layers of materials, including two thermally conductive layers of copper and an EMI shielding magnetic layer sandwiched between them, for example a sandwich of copper/Kovar/copper.

According to another aspect of the present invention there is provided an assembly of an integrated circuit chip and an integrated circuit package, comprising: an integrated circuit chip; a integrated circuit package comprising a body, and a plurality of electrically conductive terminal members; the body of the package having a substrate portion supporting the chip and a dielectric portion cooperating with the substrate enclosing the integrated circuit chip, with electrical connections extending between the chip and the electrically conductive terminal members, and with the conductive terminal members extending through the dielectric portion of the body to an exterior of the body; the package providing a combined electromagnetic shielding and heat dissipation means, the combined electromagnetic shielding and heat dissipation means comprising a plurality of layers forming a laminate structure extending over at least part of the dielectric portion and being thermally coupled with the substrate portion of the body, the plurality of layers including a layer of a thermally conductive material, a layer of a magnetic material having a high magnetic permeability for electromagnetic radiation generated by the integrated circuit chip, at least one of said plurality of layers being electrically conductive and having conductive means for making a ground connection, and the integrated circuit chip being thermally coupled to the combined electromagnetic shielding and heat dissipation means through the substrate portion.

According to yet another aspect of the present invention there is provided an integrated circuit package comprising: a body comprising a dielectric portion cooperable with a substrate portion for enclosing an integrated circuit with electrically conductive members extending from the integrated circuit through the dielectric portion of the body to an exterior of the body, the substrate portion comprising a conductive region forming a die attach pad for the integrated circuit, and conductive means provided for grounding the die attach pad.

To improve electromagnetic shielding, the IC is preferably mounted on a grounded conductive die attach area of the package substrate, which brings a ground plane close to the integrated circuit. This may be accomplished by provision of a ground connection from a conductive die attach pad area to one or more fingers of the fingers of a conventional lead frame, so as to provide connections to one or more external pins of the package for grounding the die attach pad. Preferably a plurality of ground connections are provided from the lead frame to the die attach pad to reduce package inductance.

Advantageously the IC is mounted in the IC package so that the active face of the integrated circuit die faces the ground plane of a PCP, and so that the combined electromagnetic shielding and thermal dissipation structure is coupled to the back of the die through the substrate. Thus the IC is both thermally coupled with the package and grounded. Furthermore the active face of the integrated circuit chip, i.e. the die face on which the integrated circuit is fabricated, and which is the major source of electromagnetic radiation, is in close proximity to and facing the PCP ground plane. Thus, electromagnetic radiation from the die is intercepted by the ground plane, close to its source.

Thus the present invention provides a package for an integrated circuit and an assembly of an integrated circuit and an integrated circuit package, in which the above mentioned problems are obviated.

BRIEF DESCRIPTION OF THE DRAWINGS

Embodiments of the invention will now be described by way of example, with reference to the accompanying drawings, in which.

DESCRIPTION OF THE PREFERRED EMBODIMENTS

Figure 1:
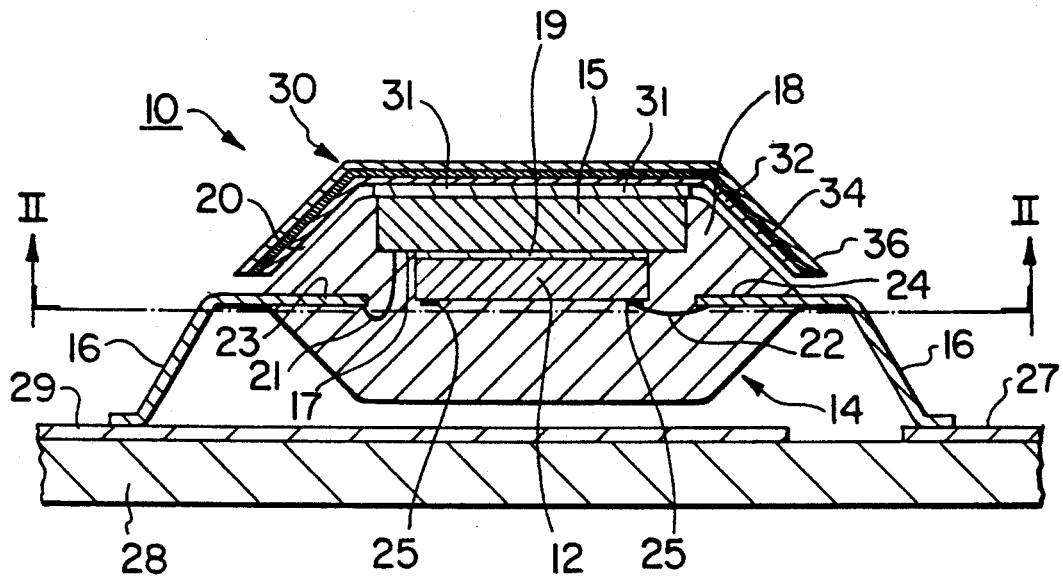
FIG. 1 shows a schematic cross-sectional view through an integrated circuit package according to a first embodiment of the present invention.
Figure 2:
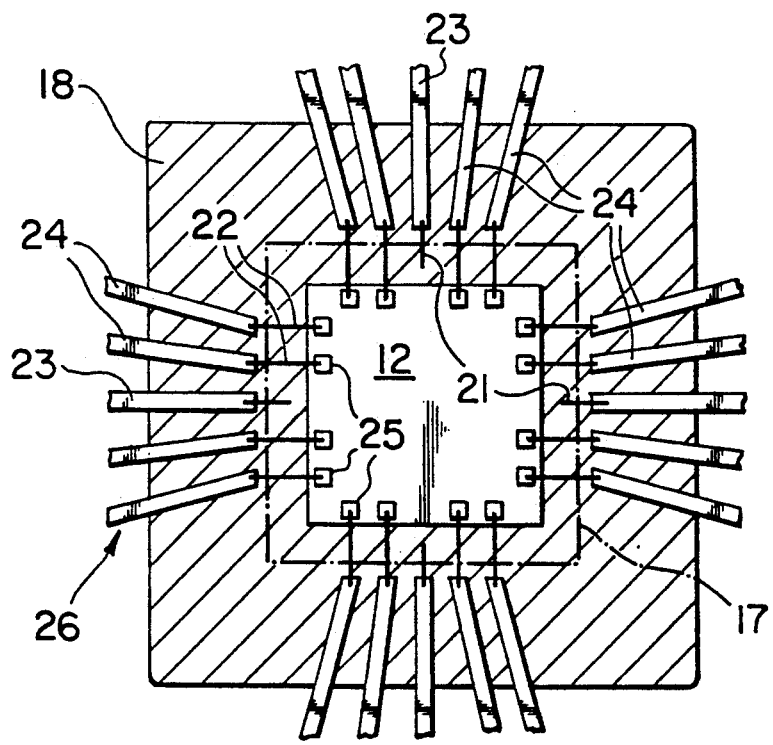
FIG. 2 shows a schematic cross-sectional view of the integrated circuit package of the first embodiment through line II—II in FIG. 1.

An integrated circuit package 10 for an integrated circuit (IC) die 12 according to a first embodiment of the present invention is shown schematically in FIGS. 1 and 2. The integrated circuit die (chip) 12 is supported within a body 14 of the package comprising a substrate portion 15 of the package comprising a thermally conductive material on which the die is supported, and a dielectric portion 18 of the body, which together with the substrate portion 15 encloses the integrated circuit chip 12. The package 10 includes suitable external electrically conductive terminal members in the form of terminal pins 16. Electrical connections are provided in a conventional manner via leadwires 22 from bondpads 25 on the integrated die 12 to conductive fingers 24 of a lead frame which extends through the dielectric body 18 to the external terminal pins 16. Electrical grounding connections also extend from the chip 12 through the body 18 to an exterior of the package to provide for connections to external circuitry 27 provided on a printed circuit pack (PCP) 28 supporting the packaged IC (FIG. 1). The substrate portion 15 of the body 18 comprises a slug of thermally conductive metal or metal alloy, e.g. copper, on which is provided an electrically conductive die attach pad 17. The IC chip 12 is affixed to the die attach pad 17 by a thermally and electrically conductive adhesive layer 19 and a ground connection 21 is provided between the die attach pad 17 and selected conductive members 23 of the lead frame 26. As shown in FIG. 2, the die attach pad 17 is electrically connected to, in this example, one of the lead frame fingers 23 on each side of the square array of the lead frame fingers 26, to allow for grounding of the die attach pad 17 via one or more external conductor pins 16. Provision for grounding the die attach pad 17 permits bringing the ground plane 29 from the PCP 28 into closer proximity to the integrated circuit 12, thus intercepting radiated electromagnetic emission from the integrated circuit close to its source. Package inductance is reduced by connecting the die attach pad 17 to ground at multiple points.

A combined electromagnetic shielding and heat dissipating means is provided extending over the dielectric portion of the body of the package, the shielding and heat dissipating means comprising a plurality of layers 32, 34 and 36, of materials forming a laminate structure 30 which is thermally coupled to the heat slug 15 via another layer of conductive adhesive 31. The plurality of layers 32, 34 and 36 comprise different materials which together provide characteristics required for thermal dissipation and electromagnetic shielding, i.e. magnetic permeability, thermal conductivity, and electrical conductivity. A first layer 32 comprises a material which is a thermally conductive, i.e. copper to provide heat dissipation. An overlying layer 34 is provided by a magnetic material having a high magnetic permeability for radiation generated by operation of the integrated circuit. A suitable magnetic material, e.g. Kovar, provides absorption of electromagnetic energy by magnetic effects. A third layer 36 is provided by another layer of a thermally conductive material, i.e. another layer of copper. At least one of the layers is electrically conductive, i.e. the copper layers 32 and 36, to allow for grounding of the layer to provide additional electromagnetic shielding by electroconductive effects. The surface of the layer 36 of copper extends over the body of the package to provide a sufficiently large exposed surface area for dissipation of heat generated by operation of the IC.

Preferably as shown in FIG. 1, the IC die 12 is mounted within the package so as to face the PCP, and a grounded electrically conductive die attach pad 17 is provided on substrate 15 for supporting the die 12 at the top of the package. The integrated circuit chip is thus located between the grounded die attach pad and the ground plane of the PCP to maximize electromagnetic control. Since the plastic or ceramic dielectric materials used for conventional IC packaging have no magnetic properties, any radiation from the source, i.e. generated by active devices on the enclosed IC 12, passes substantially unattenuated through the package body 18. Thus the provision of a combined electromagnetic shielding and thermal dissipation structure 30 extending around the dielectric portion 18, is effective in covering exposed surface of the package to attenuate radiated electromagnetic emission from the IC and provides a sufficiently large exposed surface area for effective thermal dissipation.

Figure 3:
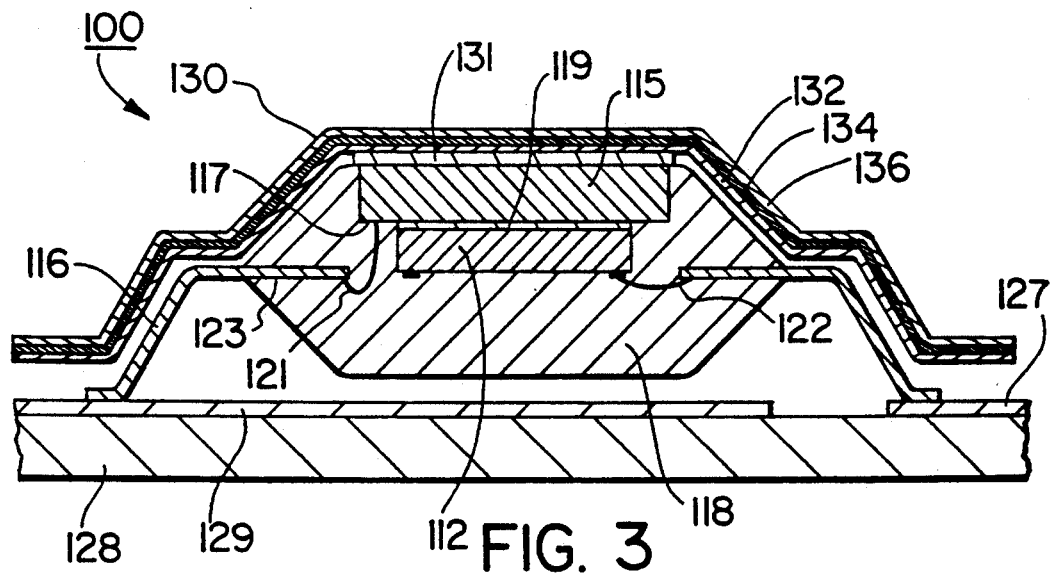
FIG. 3 shows a schematic cross-sectional view through an integrated circuit package according to a second embodiment of the present invention.

As shown in FIG. 3, a package 100 according to a second embodiment is similar to that shown in FIG. 1, with corresponding parts labelled with the same reference numerals incremented by 100. Advantageously, in the structure shown in FIG. 3, the shielding and heat dissipation structure 130 extends laterally to cover the external terminal pins 116, thus shielding and attenuating radiation from the pins 116, as well as providing an increased exposed surface area for heat dissipation from the laminated structure 130.

Figure 4:
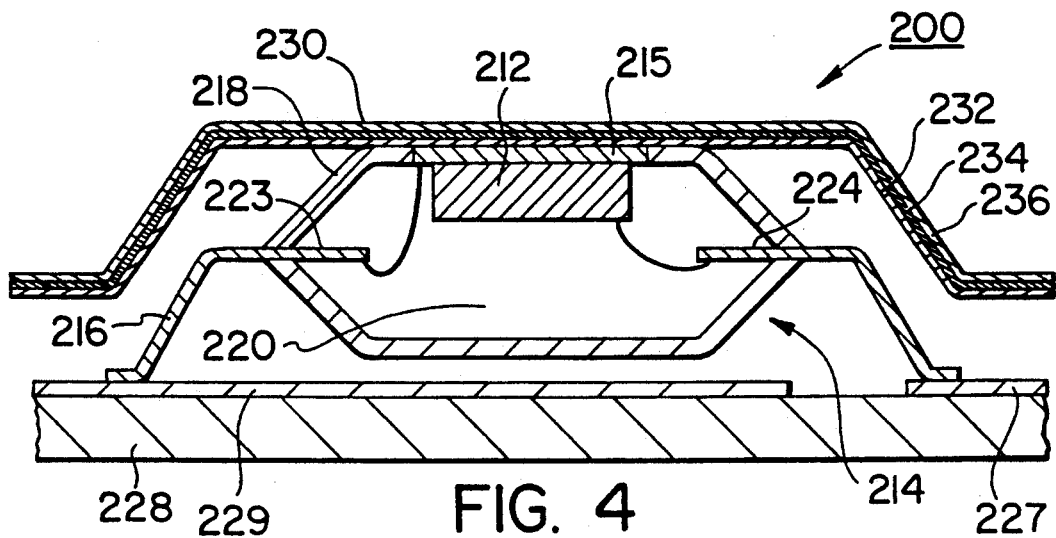
FIG. 4 shows a schematic cross-sectional view of the integrated circuit package according to a third embodiment.

FIG. 4 shows package 200 according to another embodiment which is similar to the second embodiment except that the body 214 of the package comprises a dielectric portion 218 which together with the substrate 215 forms hermetically sealed chamber 220 enclosing the integrated circuit chip 212. The IC chip 212 is thermally coupled through the substrate 215 to a laminated electromagnetic shielding and heat dissipation structure 230, similar to the structure 130 of the second embodiment, and covers the terminal pins 216.

While Kovar has excellent electromagnetic shielding properties, it has poor thermal conductivity, and inferior electrical conductivity relative to, for example, copper. Thus for optimum thermal and EMC, a composite laminar shield structure comprising layers of copper and Kovar, or a copper/Kovar/copper sandwich layer is preferred.

Magnetic materials for the magnetic layer suitable for the shielding and heat dissipating structure of both the first and second embodiments, other than Kovar, for example, are other known magnetic materials including Mu-metal, and other nickel-iron alloys.

Copper is commonly used in integrated circuit packaging to form lead frames and is both a good thermal conductor and a good electrical conductor, but is not a magnetic material. Since Kovar, and other magnetic materials, do not have sufficient electrical and thermal conductivity to be used alone for the heat dissipating and electromagnetic shielding structure, the combination of a layer of magnetic material with copper makes use of the complementary characteristics of these materials.

Packages according to embodiments described above may be used with integrated circuits dissipating 2 Watts, or more, of heat.

Figure 5:
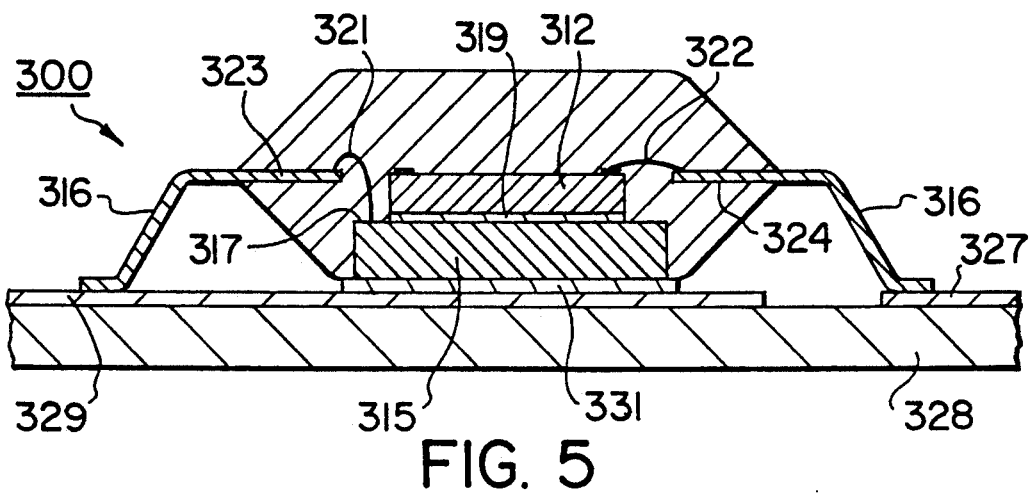
FIG. 5 shows a schematic cross-sectional view of an integrated circuit package of a fourth embodiment.

In an integrated circuit package according to a fourth embodiment of the present invention, shown in FIG. 5, suitable for use with integrated circuits such as ASIC dissipating less than 1 W of power, the package is similar to that shown in FIGS. 1 to 4 except that in the assembly of the package 314 with an integrated circuit 312, the integrated circuit is mounted on a thermally conductive substrate portion 315 of the body of the package and enclosed within the dielectric portion 318 of the package so that the substrate 315 is thermally coupled to a ground plane conductor 329 on an underlying PCP 328, through a thermally conductive adhesive layer 319. As in packages according the first, second and third embodiments, electrical connections 322 are provided to conductive fingers 324 of a lead frame, and a grounding connection may be provided between an electrically conductive die attach area 317 and selected lead frame fingers 323 to permit grounding of the substrate 315 through one or more of the external terminal members 316 to the ground plane conductor 329 of the underlying PCP 328.

In a variation of the structure of the fourth embodiment (not shown), an electromagnetic shielding and heat dissipating structure similar to one of the shielding structures 30, 130 and 230 shown FIGS. 1, 3 and 4 respectively, may be provided as a cover on the top surface of the dielectric body 318. A ground connection may be provided to the shielding structure. In this variation, the shielding structure functions primarily for electromagnetic shielding. While radiated heat may be dissipated by the laminated structure, conduction of heat from the IC occurs primarily through the substrate to the ground plane of the PCP.

Figure 6:
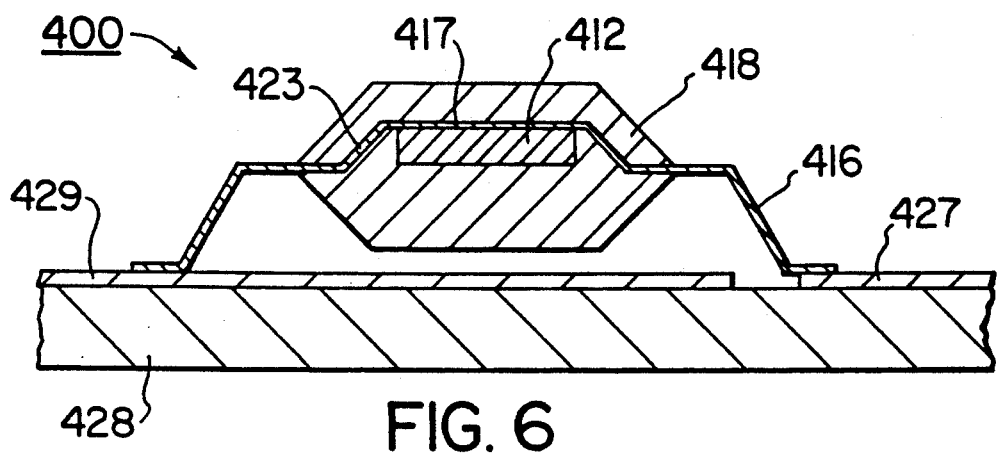
FIG. 6 shows a schematic cross-sectional view of an integrated circuit package according to a fifth embodiment.
Figure 7:
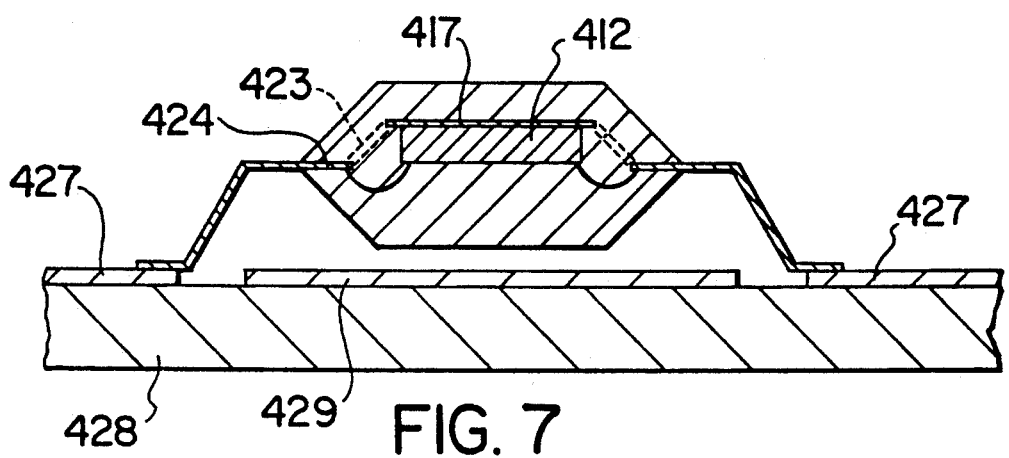
FIG. 7 shows another schematic cross-sectional view of an integrated circuit package according to a fifth embodiment.
Figure 8:
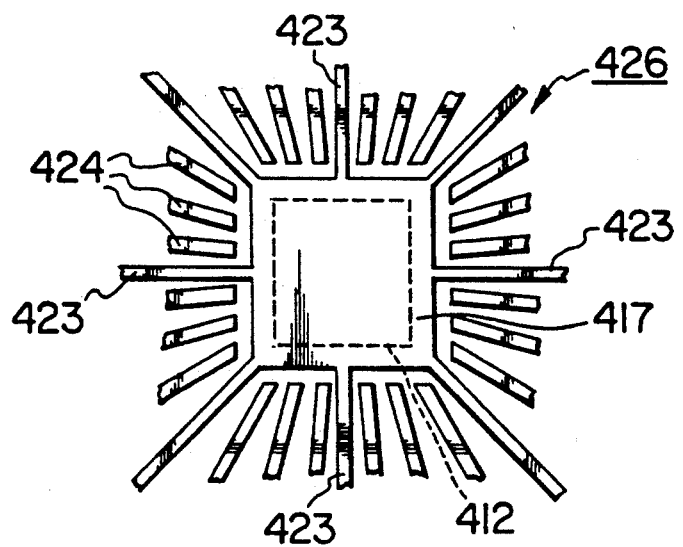
FIG. 8 shows a schematic view of part of the integrated circuit package according to the fifth embodiment.
Figure 9:
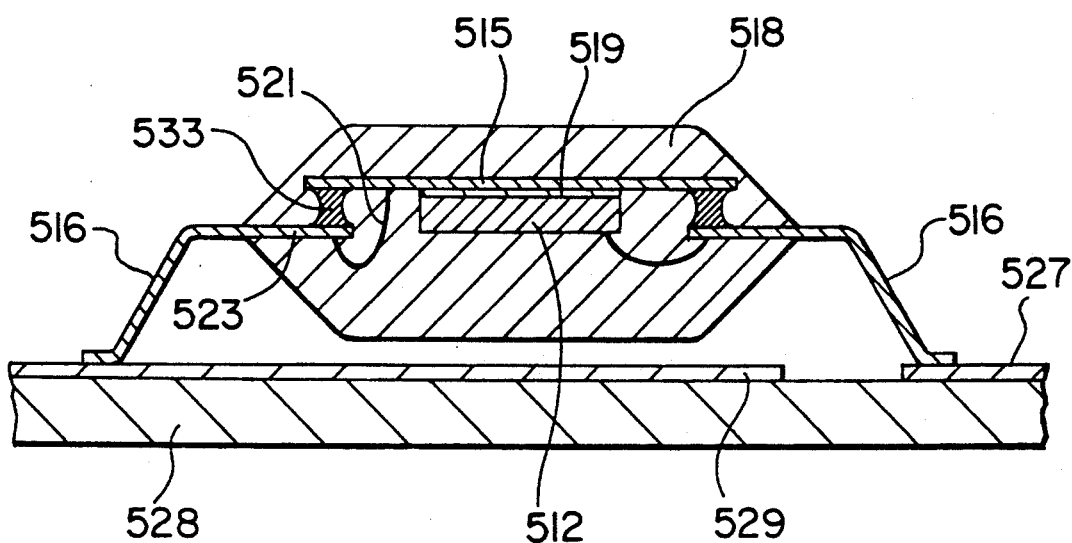
FIG. 9 shows a schematic cross-sectional view of an integrated circuit package according to a further embodiment.

A package 400 according to a fifth embodiment of the present invention as shown in FIGS. 6, 7 and 8 includes a dielectric body 418 enclosing a chip 412 supported on a conductive die attach pad 417 which is integral with a lead frame having conductive fingers 424. The conductive die attach pad 417 may be connected directly to ground through integral conductive fingers 423 of the lead frame. Thus the integrated circuit chip is bonded to the conductive die attach pad, wirebonding of leads between the die attach pad and the lead frame is avoided.

A lead frame having an integral die attach pad of a configuration similar to that of the fifth embodiment may alternatively be used in a package similar to that of the first embodiment, having an electromagnetic shielding and heat dissipation structure.

In a package 500 according to a further embodiment of the invention, a slug of conductive metal, e.g. copper forms a substrate 515 for the integrated circuit 512 which is enclosed within the dielectric 518 forming the body of the package. The metal substrate 515 is bonded with adhesive 533 to the integrated circuit chip 512 and to conductive fingers 524 of the lead frame, with a grounding connection being provided through one of the lead frame fingers 523, through an external pin 516 to a ground plane 529 of an underlying printed circuit pack 528.

In some embodiments described above the dielectric of forming the body encapsulates the integrated circuit and conductors within the package. In alternative embodiments, hermetically sealed packages may be provided in which a dielectric cover portion of the package cooperates with a substrate to define a cavity or chamber enclosing the chip. Furthermore, although the figures show packages with IC chips wirebonded to the lead frame, other forms of electrical interconnections, e.g. TAB leads, may alternatively be used.

Although embodiments described above show single chips in individual packages, alternative embodiments take the form of a multi-chip module which houses two or more integrated circuit chips.

Although particular embodiments of the invention have been described in detail, it should be appreciated that numerous modifications, variations and adaptations may be made without departing from the scope of the invention as defined in the claims.

We claim:

1. An integrated circuit package, comprising:
a body comprising a dielectric portion cooperable with a substrate portion for enclosing the integrated circuit with electrically conductive members extending from the integrated circuit through the dielectric portion of the body to an exterior of the body;
the body also comprising a combined electromagnetic shielding and heat dissipation means comprising a plurality of layers forming a laminate structure overlying the dielectric portion and including:
a layer of a thermally conductive material;
a layer of a magnetic material having a high magnetic permeability to electromagnetic radiation generated by the integrated circuit;
at least one of said plurality of layers comprising an electrically conductive material and having conductive grounding means.

2. An integrated circuit package according to claim 1 wherein the substrate portion comprises a conductive region forming a die attach pad for the integrated circuit, and conductive means are provided for grounding the die attach pad.

3. An integrated circuit package according to claim 1 wherein the substrate portion of the body is thermally and electrically conductive and the shielding and heat dissipation means is thermally coupled to the substrate portion of the body and extends over the dielectric portion of the body.

4. An integrated circuit package according to claim 1 wherein the thermally conductive material comprises copper.

5. An integrated circuit package according to claim 1 wherein the magnetic material is selected from the group consisting of Kovar, Mu-metal and nickel-iron alloys.

6. An integrated circuit package according to claim 1 wherein the electromagnetic shielding and heat dissipation means comprises a first layer of copper, an overlying layer of Kovar and another layer of copper, the first copper layer being thermally coupled to the substrate portion.

7. An assembly of an integrated circuit chip and an integrated circuit package, comprising:
an integrated circuit chip;
an integrated circuit package comprising a body; and
a plurality of electrically conductive terminal members;
the body of the package having a substrate portion supporting the chip and a dielectric portion cooperable with the substrate enclosing the integrated circuit chip, with electrical connections extending between the chip and the electrically conductive terminal members, and with the conductive terminal members extending through the dielectric portion of the body to an exterior of the body;
the package providing a combined electromagnetic shielding and heat dissipation means, the combined electromagnetic shielding and heat dissipation means comprising a plurality of layers forming a laminate structure extending over at least part of the dielectric portion and being thermally coupled with the substrate portion of the body;
the plurality of layers including:
a layer of a thermally conductive material;
a layer of a magnetic material having a high magnetic permeability for electromagnetic radiation generated by operation of the integrated circuit chip;
at least one of said plurality of layers being electrically conductive and having conductive means for making a ground connection;
the integrated circuit chip being thermally coupled to the combined electromagnetic shielding and heat dissipation means through the substrate portion.

8. An assembly according to claim 7 wherein the substrate comprises an electrically conductive material providing a die attach pad for the integrated circuit chip, and conductive means are provided for grounding the die attach pad.

9. An assembly according to claim 8 wherein an electrical connection is provided from the die attach pad to at least one of said electrically conductive terminal members.

10. An assembly according to claim 8 wherein the assembly includes a conductive lead frame, and the die attach pad is integral with the conductive lead frame.

11. An assembly according to claim 7 wherein the package is supported on a printed circuit pack including a ground plane, the package being mounted so that the electrically active face of the integrated circuit chip within the package faces the ground plane of the printed circuit pack.

12. An assembly according to claim 7 including a printed circuit pack supporting the package, the printed circuit pack having a ground plane conductor;
the package is mounted so that the electrically active face of the integrated circuit chip within the package faces the ground plane of the printed circuit pack; and
the substrate of the package comprises an electrically conductive material providing a die attach pad for the integrated circuit chip, the die attach pad having an electrical connection to at least one terminal member of the package whereby the die attach pad is electrically connected to the ground plane of the printed circuit pack.

13. An assembly according to claim 7 wherein the combined electromagnetic shielding and heat dissipation comprises a first layer of an electrically and thermally conductive material and second layer of another material having a relatively low electrical conductivity and high magnetic permeability, the first and second layers being laminated together.

14. An assembly according to claim 13 wherein the first layer comprises a layer of copper and the second layer comprises a layer of Kovar.

15. An assembly according to claim 7 wherein the shielding means and heat dissipation means comprises a first layer of a thermally and electrically conductive material, an overlying layer of a magnetic material and another layer of a thermally and electrically conductive material.

16. An assembly according to claim 15 wherein the thermally and electrically conductive material comprises copper.

17. An assembly according to claim 15 wherein the magnetic material is selected from the group consisting of Kovar, Mu-metal and nickel-iron alloys.

18. An assembly according to claim 7 wherein the combined electromagnetic shielding and heat dissipation means extends over at least parts of the conductive terminal members on the exterior of the body of the package.

19. An assembly according to claim 7 wherein the laminate structure includes an exposed layer of thermally conductive material having sufficient surface area to dissipate heat generated by operation of the integrated circuit chip.

* * * * *